United States Patent
Bhattacharyya

(10) Patent No.: US 8,159,875 B2
(45) Date of Patent: Apr. 17, 2012

(54) METHODS OF STORING MULTIPLE DATA-BITS IN A NON-VOLATILE MEMORY CELL

(75) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 81 days.

(21) Appl. No.: 12/547,130

(22) Filed: Aug. 25, 2009

(65) Prior Publication Data

US 2009/0316480 A1  Dec. 24, 2009

Related U.S. Application Data

(62) Division of application No. 12/241,264, filed on Sep. 30, 2008, now Pat. No. 7,579,242, which is a division of application No. 11/218,849, filed on Sep. 1, 2005, now Pat. No. 7,429,767.

(51) Int. Cl.
*G11C 16/04* (2006.01)
(52) U.S. Cl. .............................. 365/185.03; 365/185.18
(58) Field of Classification Search .............. 365/185.03, 365/185.18
See application file for complete search history.

(56) References Cited

U.S. PATENT DOCUMENTS

| | | | |
|---|---|---|---|
| 4,870,470 A | 9/1989 | Bass, Jr. et al. | |
| 5,886,368 A | 3/1999 | Forbes et al. | |
| 6,514,828 B2 | 2/2003 | Ahn et al. | |
| 6,586,797 B2 | 7/2003 | Forbes et al. | |
| 6,632,714 B2* | 10/2003 | Yoshikawa | 438/258 |
| 6,664,589 B2 | 12/2003 | Forbes et al. | |
| 6,713,810 B1 | 3/2004 | Bhattacharyya | |
| 6,743,681 B2 | 6/2004 | Bhattacharyya | |
| 6,754,108 B2 | 6/2004 | Forbes | |
| 6,759,712 B2 | 7/2004 | Bhattacharyya | |
| 6,768,156 B1 | 7/2004 | Bhattacharyya | |
| 6,778,441 B2 | 8/2004 | Forbes et al. | |
| 6,784,480 B2 | 8/2004 | Bhattacharyya | |
| 6,849,464 B2 | 2/2005 | Drewes | |
| 6,864,139 B2 | 3/2005 | Forbes | |
| 6,900,455 B2 | 5/2005 | Drewes | |
| 6,903,969 B2 | 6/2005 | Bhattacharyya | |
| 6,917,078 B2 | 7/2005 | Bhattacharyya | |
| 6,927,145 B1* | 8/2005 | Yang et al. | 438/420 |
| 6,933,572 B2 | 8/2005 | Bhattacharyya | |
| 6,936,884 B2 | 8/2005 | Chae et al. | |
| 7,120,063 B1* | 10/2006 | Liu et al. | 365/185.03 |
| 2003/0042527 A1 | 3/2003 | Forbes et al. | |
| 2003/0042532 A1 | 3/2003 | Forbes | |
| 2003/0042534 A1 | 3/2003 | Bhattacharyya | |
| 2003/0043632 A1 | 3/2003 | Forbes | |
| 2003/0043633 A1 | 3/2003 | Forbes et al. | |

(Continued)

OTHER PUBLICATIONS

B. Govoreanu et al.; A Figure of Merit for Flash Memory Multi-Layer Tunnel Dielectrics; Simulation of Semiconductor Processes and Devices; 2001; pp. 270-273.

(Continued)

*Primary Examiner* — Huan Hoang
(74) *Attorney, Agent, or Firm* — Leffert Jay & Polglaze, P.A.

(57) ABSTRACT

Methods of storing multiple data-bits in a non-volatile memory cell are carried out by trapping carriers in a composite trapping layer formed over a tunnel insulator layer. The composite trapping layer contains a plurality of band engineered sub-layers providing a plurality of charge trapping layers.

20 Claims, 8 Drawing Sheets

U.S. PATENT DOCUMENTS

| | | |
|---|---|---|
| 2003/0043637 A1 | 3/2003 | Forbes et al. |
| 2003/0045082 A1 | 3/2003 | Eldridge et al. |
| 2003/0048666 A1 | 3/2003 | Eldridge et al. |
| 2003/0089942 A1 | 5/2003 | Bhattacharyya |
| 2003/0181018 A1 | 9/2003 | Geusic et al. |
| 2004/0264236 A1 | 12/2004 | Chae et al. |
| 2005/0001232 A1 | 1/2005 | Bhattacharyya |
| 2005/0247970 A1 | 11/2005 | Jeon et al. |

OTHER PUBLICATIONS

Jong Jin Lee et al.; Novel Nonvolatile Memory Device Using Metal Nanocrystals Embedded in High-K for Improved Data Retention; NV Workshop; 2005; pp. 1-2.

X. Wang et al.; A Novel Monos-Type Nonvolatile Memory Using High-k Dielectrics for Improved Data Retention and Programming Speed; IEEE Trans. Electron Devices; vol. 51, No. 4; Apr. 2004; pp. 597-602.

B. Govoreanu et al.; Variot: A Novel Multilayer Tunnel Barrier Concept for Low-Volatge Nonvolatile Memory Devices; IEEE Electron Device Letters; vol. 24, No. 2; Feb. 2003; pp. 99-101.

C. H. Lai et al.; Novel $SiO_2$/AlN/HfAlO/$IrO_2$ Memory With Fast Erase Large $\Delta V_{th}$ and Good Retention; NVSMW; 2005; pp. 1157-1159.

S. Tiwari et al.; Volatile and Non-Volatile Memories in Silicon With Nano Crystal Storage; IEDM; 1995; pp. 20.4.1-20.4.4.

J.H. Chen et al.; Nonvolatile Flash Memory Device Using Ge Nano-Crystals Embedded in HfAlO High-k Dielectric; NVM Workshop; 2005; p. 1124.

J. Willer et al.; 110nm NROM Technology for Code and Data Flash Products; Symposium on VLSI Technology Digest of Technical Papers; 2004; pp. 76-77.

K. K. Likharev; Riding the Crest of a New Wave in Memory; Circuits and Devices; Jul. 2000; pp. 16-21.

\* cited by examiner

METHODS OF STORING MULTIPLE DATA-BITS IN A NON-VOLATILE MEMORY CELL

CROSS-REFERENCE TO RELATED APPLICATIONS

This application is a divisional of U.S. patent application Ser. No. 12/241,264, filed Sep. 30, 2008 now U.S. Pat. No. 7,579,242 and titled "HIGH PERFORMANCE MULTI-LEVEL NON-VOLATILE MEMORY DEVICE," which is a divisional of U.S. patent application Ser. No. 11/218,849 (now U.S. Pat. No. 7,429,767), filed Sep. 1, 2005 and titled "HIGH PERFORMANCE MULTI-LEVEL NON-VOLATILE MEMORY DEVICE," which are commonly assigned and incorporated by reference in their entirety herein.

TECHNICAL FIELD

The present invention relates generally to integrated circuits and in particular the present invention relates to non-volatile memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory), a sub-type of which is DRAM (dynamic random-access memory). DRAM is characteristically found in use as main memory in a computer environment. DRAM functions as a read and write memory; that is, you can both write data into DRAM and read data from DRAM. This is in contrast to read-only memory (ROM), which permits you only to read data. Most RAM is volatile, which means that it requires a steady flow of electricity to maintain its contents. As soon as the power is turned off, whatever data was in RAM is lost. Computers almost always contain a small amount of ROM that holds instructions for starting up the computer.

EEPROM (electrically erasable programmable read-only memory) and Flash memories are special types of non-volatile ROMs that can be written and erased. A Flash memory is a type of EEPROM that is typically erased and reprogrammed in blocks instead of a single bit or one byte (8 or 9 bits) at a time. Flash and EEPROM memories may use floating gate technology or trapping technology non-volatile memory cells. Floating gate cells include source and drain regions that are laterally spaced apart to form an intermediate channel region. The source and drain regions are typically formed in a common horizontal plane of a silicon substrate. The floating gate, generally made of doped polysilicon, is disposed over the channel region and is electrically isolated from the other cell elements by oxide. The non-volatile memory function for the floating gate technology is created by the absence or presence of charge stored on the isolated floating gate. In floating node/embedded trap non-volatile memory cells, the stored charge is "trapped" and stored in a non-conductive trapping layer. One example of this trapping technology that functions as a non-volatile memory is the silicon-oxide-nitride-oxide-silicon (SONOS) architecture. In the SONOS architecture, the nitride trap layer can capture and store electrons or holes in order to act as a non-volatile memory.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

A problem in Flash/EEPROM floating gate and SONOS memory cell arrays is that voltage scalability affects the minimum cell size, and consequently the overall memory density of any resulting array. Both SONOS and floating gate Flash/EEPROM memories also consume relatively high power compared to other memory technologies, requiring external or on-chip high voltage/current supplies for programming and erase operations. Due to the high programming voltage requirement, neighboring cells must be separated sufficiently apart (significantly greater than the minimum feature size) so as not to be disturbed by the capacitive coupling effect during programming of the active cell. This problem is more severe with scaling of the feature size capability, affecting cell density. In addition, the high programming/erase voltages diminish device endurance and retention by damaging the materials of the memory cell and generating flaws. An additional problem in Flash/EEPROM and SONOS memory devices is the slow write and erase speed, which severely limits their application as general use memory cell arrays and devices. Write and erase speeds in these devices are in the order of milliseconds, as compared to DRAM, which is in the order of tens of nanoseconds for main memory applications. As integrated circuit processing techniques improve, manufacturers try to reduce the feature sizes of the devices produced and thus increase the density of the IC circuits and memory arrays. Additionally, with progressive scaling of feature size, fundamental device leakage issues such as short-channel effects and gate dielectric leakage need to be contained in order to take advantage of scaling.

For the reasons stated above, and for other reasons stated below which will become apparent to those skilled in the art upon reading and understanding the present specification, there is a need in the art for low power scalable high performance non-volatile memory cell devices.

DETAILED DESCRIPTION

Figure 2:
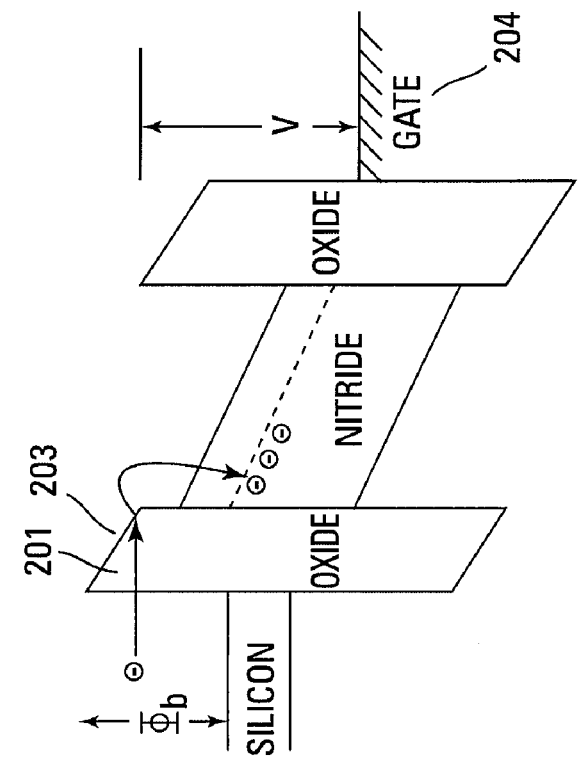
FIG. 2 shows an energy band diagram of the SONOS structure of FIG. 1 under a bias condition.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including bulk silicon, silicon-on-sapphire (SOS) technology, silicon-on-insulator (SOI) technology, silicon-on-nothing, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Non-volatile memory devices and arrays, in accordance with embodiments of the present invention, facilitate the utilization of non-volatile memory cells that have band engineered gate-stacks and multiple charge trapping layers in EEPROM and block erasable memory devices, such as Flash memory devices. Embodiments of the present invention allow a multiple trapping site gate-insulator stack memory cell that utilizes a band engineered direct tunneling or crested barrier tunnel layer and charge blocking layer for programming and erasure. Charge retention is enhanced by utilization of nano-crystals and/or bulk trapping materials in a composite non-conductive trapping layer and a high K dielectric charge blocking layer. The band-gap engineered gate-stack with symmetric or asymmetric direct tunneling or crested barrier tunnel layers of the non-volatile memory cells of embodiments of the present invention allow for low voltage high speed tunneling programming and erase with electrons and holes, while maintaining high charge barriers and deep carrier trapping sites for good charge retention. The low voltage enhanced Fowler-Nordheim tunneling or direct tunneling program and erase capability dramatically improves write/erase speed and simultaneously reduces damage to the gate-stack and the crystal lattice from high energy carriers, reducing write fatigue and leakage issues and enhancing device lifespan, while allowing for memory cells that can take advantage of progressive lithographic and feature size scaling. Memory cell embodiments of the present invention allow multiple levels of bit storage in a single memory cell through multiple charge centroids and/or multiple threshold voltage levels and allow for single polarity programming and erasure operations. Memory cell embodiments of the present invention also allow for memory devices that can operate with the speed of DRAM, have non-volatile storage of >10 years of Flash/EEPROM, and an effectively infinite number of write/erase cycles that could be utilized as a "universal memory," eliminating the need to use separate volatile DRAM and non-volatile Flash/EEPROM memory in a given application.

In normal mode SONOS or floating gate devices, the silicon substrate is active as the source of electrons and holes during programming and erase operations. In contrast, the gate electrode serves as the source of electrons and holes during program and erase for the reverse mode device. In the case of the normal mode device, during program/erase cycling injected hot carriers adversely affect the integrity of the silicon/insulator interface as well as that of the tunnel insulator itself. Consequently, device transconductance is degraded and endurance, retention and device reliability are reduced. Reverse mode devices are relatively immune to such adverse effects at the channel silicon/insulator interface since it is relatively passive during programming and erase operations, when charge injection/extraction is occurring at the control gate.

Figure 1:
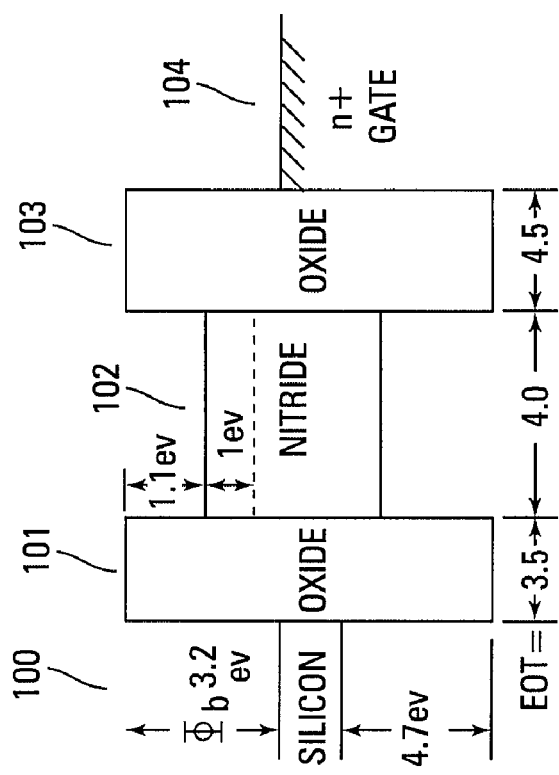
FIG. 1 shows an energy band diagram of a typical prior art SONOS structure.

FIG. 1 illustrates an energy band diagram of typical prior art silicon-oxide-nitride-oxide layers of a SONOS structure at flatbands. Flatband conditions exist when no charge is present in the semiconductor so that the silicon energy band is flat. It is assumed that this occurs at zero gate bias (neglecting the work-function difference between the gate electrode and silicon).

The illustrated structure is comprised of the silicon substrate 100, the oxide-nitride-oxide 101, 102, 103 (ONO) layer, and the control gate 104. The illustrated structure has an effective oxide thickness (EOT) of 12 nm since the tunnel oxide has an EOT of 3.5 nm, the nitride trap 102 has an EOT of 4.0 nm (physical thickness approximately 7.5 nm), and the charge blocking oxide 103 has an EOT of 4.5 nm.

SONOS and nano-crystal types of non-volatile memory devices are typically referred to as discrete trap or embedded trap devices. The charge to be stored in the trap layer 102 tunnels through the tunnel insulator 101 and is confined there in trapping sites in the trapping layer itself or in traps associated with nano-crystals due to the charge blocking insulator layer 103. This charge trapping gate stack, with its electrically isolated trapping layer, allows charge to be trapped near the channel region and affect the threshold voltage level of the non-volatile memory cell. The tunneling may be accomplished by direct and Fowler-Nordheim tunneling during write operations while holes tunnel by direct tunneling during erase operations. The trap layer 102 may be nitride for SONOS or nano-crystals (silicon, germanium, or metal embedded oxides).

Stored charge retention and erase speed sensitivity can depend on the tunneling distance (i.e., tunnel insulator thickness). For example, an increase in oxide insulator thickness from an EOT of 1 nm to 3 nm would result in a charge retention increase of approximately five orders of magnitude but also reducing the erase speed by nearly the same amount. This is due to the fact that both the back-tunneling electron current as well as the forward hole current are dependent on tunneling distance that in turn depends on the insulator thickness, given the large band energy barriers ($E_b$) of oxide of 3.2 eV for electrons and 4.7 eV for holes (with reference to silicon), respectively. The tunnel oxide 101 has an $E_b$ of approximately 9 eV, the nitride layer 102 has an $E_b$ of approximately 5.1 eV, and the charge blocking oxide has an $E_b$ of approximately 9 eV.

The band diagram of FIG. 1 also shows that the Schottky barrier height for electrons ($\Phi_b$) is 3.2 eV. $\Phi_b$ is the tunneling barrier for electrical conduction across the interface and, therefore, is of importance to the successful operation of any semiconductor device. The magnitude of $\Phi_b$ reflects the mismatch in the energy position of the majority carrier band edge of the silicon substrate 100 and the oxide tunnel insulator 101.

FIG. 2 illustrates an energy band diagram of the embodiment of FIG. 1 that is under a bias condition of V on the gate 204. Under the applied bias, the silicon-oxide interface barrier height, $\Phi_b$, does not change but the tunneling distance is reduced as shown 203 for an oxide thickness of 3.5 nm (EOT=3.5 nm).

While SONOS or nano-crystal embedded trap memory cell devices show promise in voltage scalability for non-volatile memory applications, as well as somewhat higher programming speed/endurance when compared to floating gate devices, these devices still exhibit characteristically small values of memory logic window (Vt1–Vt0), have limited speed and reliability enhancements, and exhibit tunnel oxide degradation similar to floating gate devices. This limits their application and potential and scalability in non-volatile memory. This is primarily due to the fact that a high field is still required to transport charges through the tunnel oxide and that the oxide thickness is required to be greater than 4 nm in order to meet a 10 year retention requirement.

As such, issues with prior art floating gate, SONOS and embedded trap non-volatile memory cells include, high programming voltage and power requirements, limited programming and erasure speed, limited device scalability without adversely affecting retention, and limited device endurance.

In embodiments of the present invention, the gate stack of the non-volatile memory cell comprises a band engineered charge blocking dielectric layer, a trapping layer, a band engineered tunnel layer, and a control gate forming a normal mode memory cell field effect transistor (FET) device. The channel region is formed between two source/drain regions, the band engineered direct tunneling or crested barrier tunnel layer is formed over the channel, followed in turn by the multi-trap composite trapping layer, the band engineered charge blocking dielectric layer, and the control gate. In the memory cell FET of the present invention, charge storage and programming is accomplished from the channel to the multi-level composite trapping layer, while erasure occurs through the control gate to the trapping layer and allow for positive voltage programming and erasure.

The trapping layer is formed of multiple sub-layers of materials providing a band engineered arrangement of multi-locational trapping sites (utilizing both nano-crystal trapping sites and/or layers of bulk trapping material), allowing for multiple bits to be encoded into the threshold levels of memory cells of embodiments of the present invention utilizing differing levels of applied programming voltage and generated charge centroids. In one embodiment the trapping layer consists of multiple layers of trap-free dielectric with high work function nano-crystals embedded in them. These layers of nano-crystals are preferably formed adjacent to the trapping layer/tunnel layer interface, allowing a maximum electrostatic effect by the trapped charge on the channel for a large logic window, while presenting a large physical tunnel distance and barrier energy to the trapped charge to prevent back-tunneling. In another embodiment, one or more locational trapping sub-layers with well-defined trapping energy levels of the trapping layer are formed of bulk trap dielectric with or without high work function nano-crystals. In a further embodiment, the multiple sub-layers of the trapping layer are of increasing barrier energies and increasing levels of high K values to aid in internal carrier transport and/or defining multiple threshold voltage levels at discrete programming voltages.

The tunnel layer in embodiments of the present invention comprises successive layers of tunnel insulation of differing physical thicknesses and electron tunnel barrier heights. In one embodiment, the successive layers of tunnel insulation of the tunnel layer are formed into a band-engineered crested barrier tunnel layer. In band-engineered crested barrier tunnel layers, the successive layers of tunnel insulation materials are chosen such that a thin layer of high energy barrier material is combined with one or more lower barrier layers so that both an energy barrier and a physical thickness are present to prevent carrier tunneling. Yet under an applied field, the barriers of this crested tunnel layer distort to allow for low voltage direct or enhanced Fowler-Nordhiem carrier tunneling at high fluence through the combined effects of barrier lowering and thinning. The thin layer of high energy barrier is preferably placed offset by two or more sub-layers from the substrate/tunneling insulator interface to allow for maximum energy barrier distortion under the applied voltage. This crested barrier tunnel layer, in combination with the low EOT gate-insulator stack allows for high speed, low voltage programming and erasure of the memory cell.

In another embodiment, the successive layers of tunnel insulation of the tunnel layer are formed into an asymmetric band-engineered direct tunneling tunnel layer, where the successive layers of tunnel insulation materials are chosen such that an asymmetric barrier is formed with band-offsets that allow for field-aided direct tunneling from sub-layer to sub-layer to the trapping layer when a field is applied, while presenting a high energy barrier and large physical thickness to prevent back-tunneling of the trapped charges when the field is removed. This asymmetric direct tunneling barrier tunnel layer of increasing band-gap offsets and increasing K values, in combination with the low EOT gate-insulator stack also allows for high speed, high carrier fluence, low voltage programming and erasure of the memory cell.

The charge blocking layer is also formed of one or more band engineered layers of dielectric insulator material, which preferably is a high K dielectric so as to allow for reduction in overall stack EOT. The charge blocking layer is designed to provides a high energy barrier and physical thickness to prevent electron tunneling to the control gate and aid in charge retention, while allowing a low energy barrier for holes to allow for ease of hole tunneling from the gate during erasure. In one embodiment of the present invention, the charge blocking layer forms a crested barrier layer for holes. In another embodiment of the present invention, the charge blocking layer forms an asymmetric direct tunnel barrier for holes.

In both the crested barrier and asymmetric direct tunneling tunnel layer and charge blocking layer the band-engineered high K dielectric layers provide high programming speed at reduced fields across the gate insulator dielectric stack, enhancing endurance and reliability by reducing or eliminating material damage due to high energy carrier injection. In embodiments of the present invention, the tunnel layer and charge blocking layers of the memory cell are band-engineered such that holes are injected through the charge blocking layer under a low positive voltage applied to the control gate to erase the memory cell and electrons are injected through the tunnel layer with higher positive voltages to program the memory cell.

The control gate can be formed of aluminum, tungsten, polysilicon or other conductor material and is typically coupled to a word line or control line.

It is noted that reverse mode memory cells of embodiments of the present invention, where electrons are injected from the gate to program the cell and holes injected from the channel to erase, are also possible and will be apparent to those skilled in the art with the benefit of the present invention.

As stated above, floating-gate Flash memory devices consume high power, due to requiring either an external or on-chip supply of high voltage/current for programming and erasure. Furthermore, there exists serious scalability concerns for floating-gate Flash memory device due to voltage and coupling noise scalability problems, causing issues with implementation into future technology generations. To overcome such issues, SONOS and embedded trap nano-crystal devices have been considered. SONOS and nano-crystal types of non-volatile memory devices are known as "discrete trap" or "embedded trap" devices wherein charges, after tunneling through the tunnel insulator are stored in traps associated with either nitride (for SONOS) or nano-crystals.

Electron and hole transport by tunneling is exponentially dependent on the barrier energy and the tunneling distance of the tunneling dielectric. Due to the high barrier energy at the channel Silicon-SiO$_2$ interface (3.2 eV for electron and 4.7 eV for hole), electron tunnel-current or hole tunnel-current is limited especially when oxide thickness is greater than 3.2 nm when tunneling mechanism changes from direct tunneling to Fowler-Nordheim tunneling. Consequently, write and erase speed for such devices with SiO$_2$ as the tunneling medium are carrier-transport limited. Even with significantly high program voltage levels (oxide peak field>1E7 V/cm, which would also increase noise and hot carrier device damage), attainable programming speed would only be in the orders of tens of micro-seconds, whereas a three to four orders of magnitude faster speed is desired for general memory (e.g., DRAM equivalent speed and endurance) functionality. Electron and hole currents can be significantly enhanced by replacing SiO$_2$ with a set of layered dielectrics which effectively reduces either a) the barrier energies of electrons and/or holes ("crested barrier") or b) the tunneling distance ("barrier-thining"). In addition, to ensure the required charge retention of greater than 10 years and yet attain high speed operation, the ratio of the charge current density during programming to that during standby should be in the order of 1E18. It should be noted that in the case of SONOS and Si nano-crystal devices, this current ratio is in the order of ~1E12.

Embodiments of the present invention provide improvements in device speed and simultaneously provide multi-level storage per unit cell. Two basic approaches are utilized in embodiments of the present invention to achieve high speed write and erase in non-volatile memory cells. In the first approach, a layered insulator stack structure is utilized in a crested barrier formation which combines high K dielectric layers for low voltage enhanced Fowler-Nordheim or direct tunneling by effective barrier energy lowering and tunnel-distance reduction to significantly enhance carrier fluence during programming and erasure for both electrons and holes. In the second approach a band-offset technique is utilized which layers dielectrics formed in an asymmetric direct tunnel barrier to achieve field-aided direct tunneling transport of electrons and holes through the sequential dielectric layers.

To achieve multi-level storage states, multiple well-defined trapped charge centroids are created within the dielectric stack to achieve two or more high threshold states for multi-level memories. This is achieved by either embedding multiple planes of nano-crystals or layers of bulk trapping dielectric at selected distances from the substrate or by simultaneously incorporating both a nano-crystal plane at one appropriate location and a bulk trapping dielectric layer in another appropriate location to achieve multiple threshold levels and memory cell states.

Figure 3:
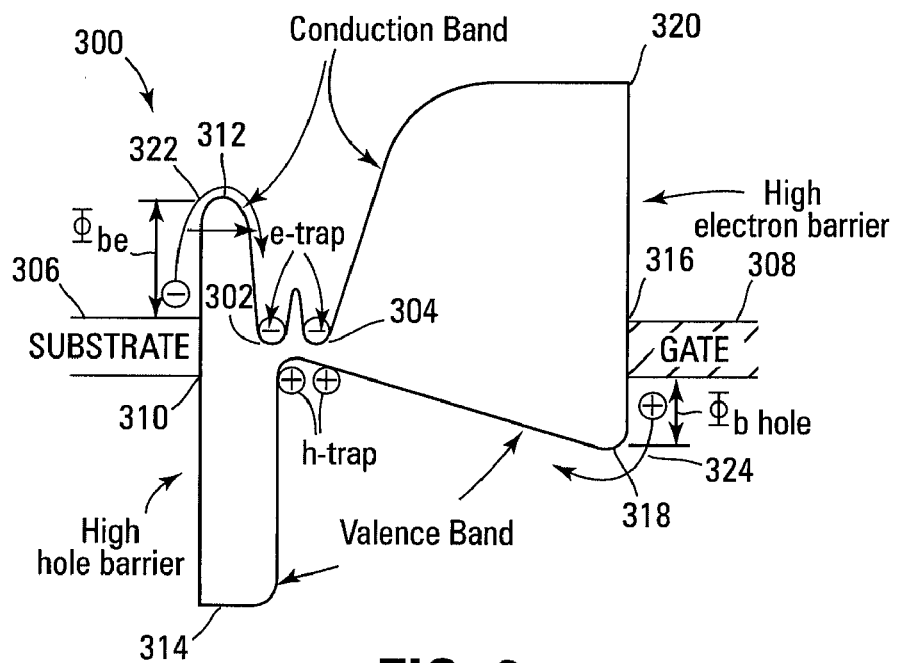
FIG. 3 shows an energy band diagram of an embodiment of the present invention.

FIG. 3 details a flat band energy diagram 300 of an embodiment of the present invention illustrating trapping in multiple location-centers 302, 304 for multilevel memory cell data storage and high fluence electron and hole programming and erasure currents. In FIG. 3, charge injection is depicted by both the substrate 306 and control gate 308. Electron injection occurs from the substrate/insulator interface 310 due to lower energy barrier 312 while hole injection at that interface is minimal due to significantly higher energy barrier 314 of that interface. At the control gate/insulator interface 316 the situation is reversed and hole injection is favored with a low hole energy barrier 318 in the valence band while electron injection is minimized due to the higher electron energy barrier 320 in the conduction band. These relative energy barriers, favoring electron injection at the substrate/insulator interface 310 and hole injection at the gate/insulator interface 316, are also strongly asymmetric such that carrier injections are discrete in terms of the energy imposed by the programming conditions.

During an erasure operation of the memory cell of FIG. 3, when the control gate 308 has a low positive potential relative to the channel 306 and/or source/drains, since the hole injection energy barrier 318 at the gate/insulator interface 316 is very low, a large hole current 324 will be observed injecting from the gate 308. Due to the large hole current the memory cell is erased at high speed as the hole charges build up at the trapping region(s) 302 and 304. Subsequently, the electrostatic potential created by the trapped holes prevent additional hole injection and a steady state is reached, thereby establishing the Low Vt state of the device (e.g., logical state 00 of the memory cell).

During a programming operation, the gate voltage 308 is further increased to an appropriate positive level relative to the channel 306, the conduction band barrier of the tunnel layer is reached and the substrate/insulator interface 310 becomes active with a high electron fluence 322 injecting to the trapping layer from the channel 306. Electron trapping in the trapping layer then takes place, at high speed, initially electrostatically neutralizing the effect of hole trapping and then subsequently trapping a net level of negative charge in the first trapping location 302 to define, for example, an intermediate Vt state (e.g., logical state 01 of the memory cell).

If during the present programming operation, or in a subsequent programming operation, the programming gate voltage is further increased, the first trapping location 302 will be saturated and the second trapping location 304 will begin to trap the additional injected electrons. Therefore, additional high threshold voltage states can be defined to achieve 2 bit levels (or more) of storage, such as 10 and 11. The two charge trapping locations 302, 304 shown in FIG. 3 can be formed by either embedding appropriate nano-crystals at differing sub-layers/positions of the trapping layer or by creating combinations of nano-crystals and bulk discrete trapping sub-layers, as detailed above. It is noted that additional charge trapping locations can be formed in the charge trapping layer and/or relative charge trapped at the charge trapping locations to provide additional bits of data storage in the memory cell 300 of FIG. 3.

Figure 4A:
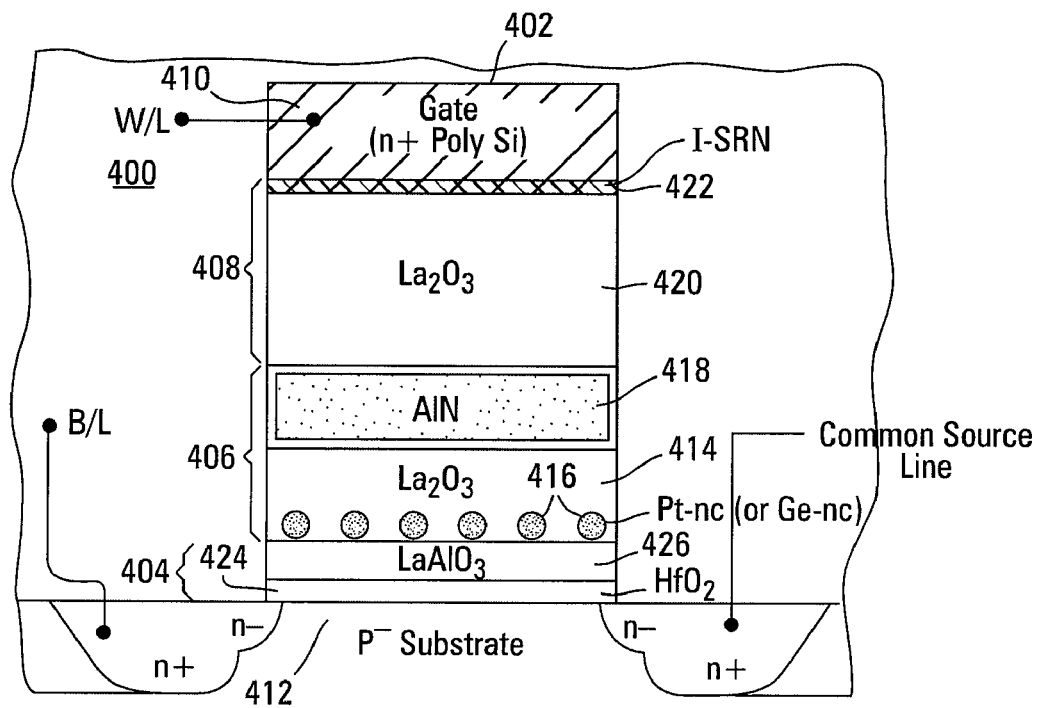
FIGS. 4A and 4B show a memory cell and an energy band diagram of one embodiment of the present invention.
Figure 4B:
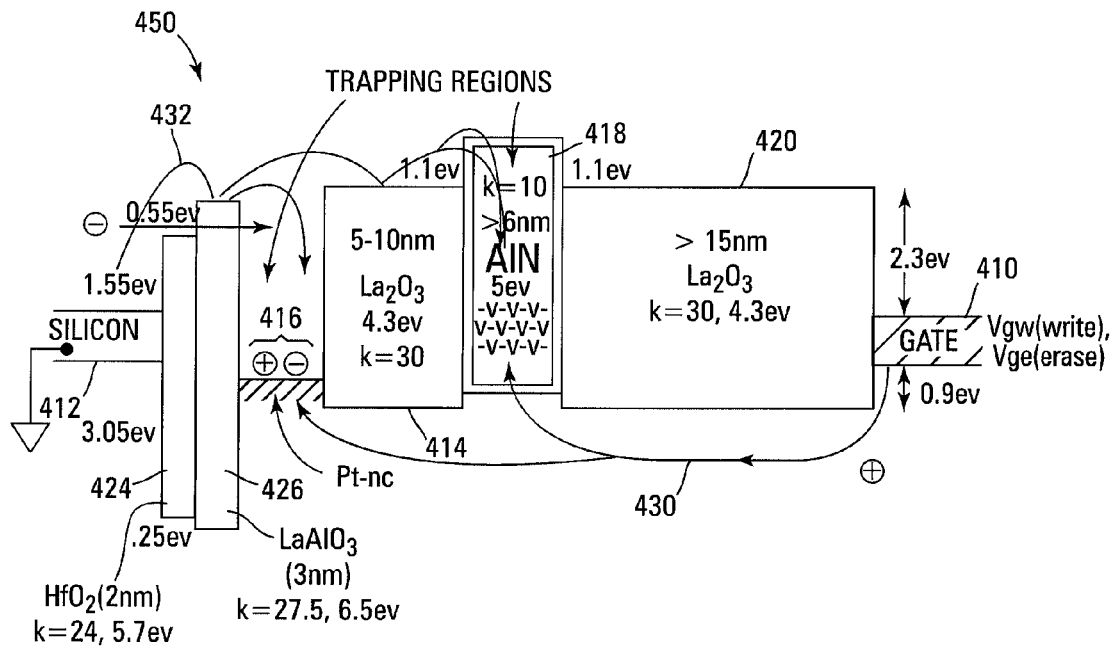

FIG. 4A details a memory cell device schematic cross section 400 of one embodiment of the present invention that utilizes an asymmetric direct tunneling tunnel layer and charge blocking layer based on sub-layers of materials of increasing conduction and/or valence band offsets. FIG. 4B details the corresponding flat band diagram 450 for the memory cell 400 of FIG. 4A.

The gate-insulator stack 402 for the memory cell 400 consists of a tunnel layer 404 having two sub-layers of tunnel dielectric of HfO$_2$ (K=24, 1 nm-2 nm thick) 424 and LaAlO$_3$ (K=27.5, 2 nm-4 nm thick) 426. This tunnel layer 404 provides an electron energy barrier (less than 2.1 eV) for enhanced direct tunneling electron injection where direct tunneling of carriers occurs through sub-layers of materials of increasing conduction and/or valence band offsets under the applied programming voltage. The tunnel layer also provides a large energy barrier (greater than 3.3 eV) for holes and hole injection. The trapping layer 406 consists of two sub-layers of La$_2$O$_3$ (K=30, 5 nm to 10 nm thick) 414 and AlN (K=10, 6 nm to 15 nm thick) 418. The first trapping location consists of a layer of nano-crystals 416 of platinum (Pt-nc, 3 nm-4 nm in diameter) or germanium (Ge-nc, 3 nm-4 nm in diameter) embedded at the interface of the LaAlO$_3$ 426 of the tunnel layer 404 and La$_2$O$_3$ 414 of the trapping layer 406. The second trapping location is provided by the layer of AlN 418, which has a high density of deep energy electronic trapping centers. The charge blocking layer 408 combines a sub-layer of La$_2$O$_3$ (10 nm to 15 nm thick) 420 with a passivating sub-layer of injector silicon-rich-nitride (I-SRN) 422 to provide uniform hole injection from a polysilicon gate electrode 410.

As shown in the flat band energy diagram 450 of FIG. 4B, the barrier energy for holes in the gate-insulator stack 402 of FIG. 4A is only 0.9 eV at the gate/charge blocking insulator interface. This allows enhanced hole injection 430 and hole trapping at the trapping locations 416, 418 to take place when a low positive gate erase voltage potential is applied. The erase state (logic state 00) for the memory cell 400 occurs when hole injection from the gate 410 reaches an electrostatic steady state with the trapped holes in the trapping locations 416, 418. During erasure, electron injection from the substrate is minimal due to the low positive applied voltage and the relatively high electron conduction band energy barriers at the substrate-insulator interface (of 2.1 eV).

During a programming operation, the gate voltage 410 is increased to an appropriate positive level relative to the channel/substrate 412 and the substrate/insulator interface becomes active with electrons overcoming the 2.1 eV barrier and injecting 432 at high speed into the trapping layer 406 from the channel 412. Electron trapping in the trapping layer then takes place, neutralizing the hole trapping and hole current and trapping a net negative charge in the first trapping location of platinum or germanium nano-crystals 416 to set an initial programmed Vt state (logical state 01). With subsequent increase in the programming gate voltage, the second trapping location in the AlN 418 will begin to trap electrons, allowing the memory cell 400 to set additional threshold voltage levels and store additional bit levels (such as logical states 10 and 11).

The physical thickness of the gate insulator stack 402 of FIGS. 4A and 4B in one embodiment will be approximately 40 nm, yet the EOT be approximately only 8 nm, allowing for low voltage programming and erasure operation. The device programming voltages will be <=+3.0V (00), +4.0V (01), +5.0V (10) and +6.0V (11) to define four Vt levels while allowing an operating speed of approximately 10-100 nsecs. The memory cell device Vts will be approximately of –2V (00), +2V (01), +4V (10) and +6V (11), respectively.

Figure 5A:
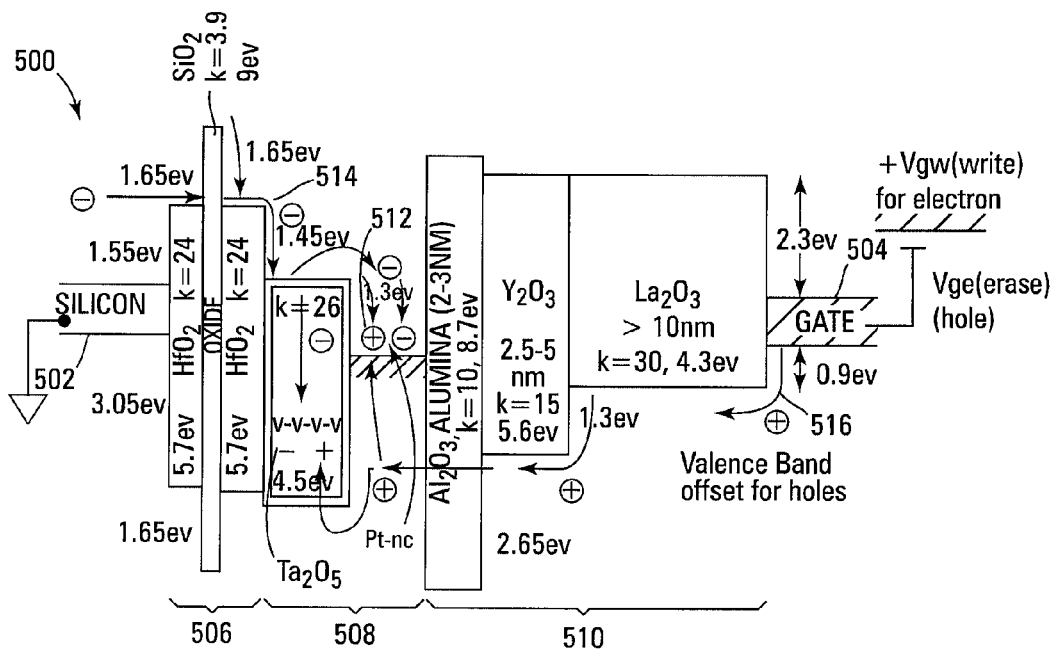
FIG. 5A shows a memory cell energy band diagram of another embodiment of the present invention.
Figure 5B:
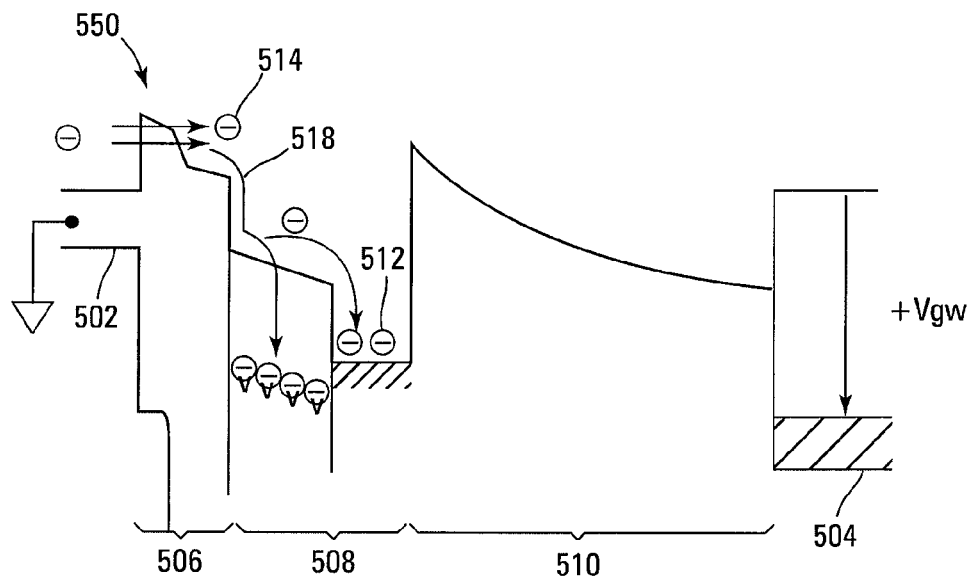
FIGS. 5B and 5C detail programming and erasure operations in the memory cell embodiment of FIG. 5A.
Figure 5C:
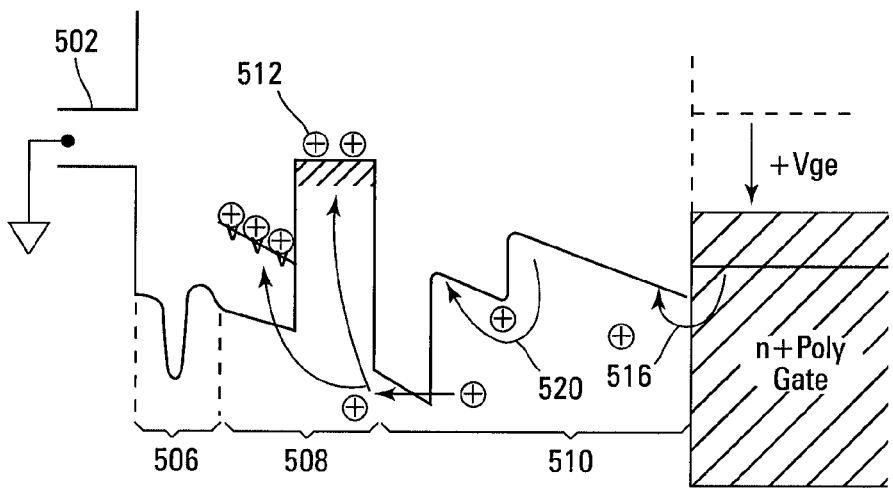

FIG. 5A details a flat band energy band diagram 500 of a memory cell of another embodiment of the present invention that utilizes a crested barrier tunnel layer and charge blocking layer with both a bulk trapping sub-layer and a nano-crystal trapping locations. FIGS. 5B and 5C detail the corresponding programming and erasure biased band diagrams 550, 570 for the memory cell 500 of FIG. 5A.

The gate-insulator stack for the memory cell 500 consists of a crested barrier tunnel layer 506 having three sequential sub-layers of tunnel dielectric consisting of 2 nm HfO$_2$/1 nm SiO$_2$/2 nm HfO$_2$. These sub-layers are arranged in a crested barrier formation to provide for low voltage Fowler-Nordheim enhanced electron injection and/or direct tunneling through the SiO$_2$ layer by the combined effects of barrier lowering and barrier thinning under an applied programming field. This tunnel layer 506 provides an electron energy barrier (less than 1.65 eV for direct tunneling) for electron injection. The tunnel layer also provides a relatively large energy barrier (greater than 3.05 eV) for holes and hole injection.

The trapping layer 508 consists of a layer of Ta$_2$O$_5$ (optionally TiO$_2$ or AlN) with deep energy traps in the bulk material. A nano-crystal plane 512 of high work function platinum (Pt-nc, 3 nm-4 nm in diameter) or germanium (Ge-nc, 3 nm-4 nm in diameter) nano-crystals serves as the second trapping location and is embedded into the Ta$_2$O$_5$ (K=26, bandgap: 4.5 eV) near its interface with the charge blocking layer 510. During programming the layers of SiO$_2$, HfO$_2$ (1.65 eV offset), Ta$_2$O$_5$ (1.45 eV offset) will also provide successive conduction band offset such that an associated drift field 518 enhances electron current 514 that is being trapped either into deep energy traps of the Ta$_2$O$_5$ or at the platinum nano-crystals, as shown in FIG. 5B.

As stated above, the nano-crystal plane 512 embedded into the Ta$_2$O$_5$ (K=26, bandgap: 4.5 eV) of the trapping layer 508 interfaces with the charge blocking layer 510. The charge blocking layer 510 consists of a high energy crested barrier of 2.5 nm of Al$_2$O$_3$ (K=10, band gap: 8.7 eV) followed by 5 nm to 10 nm of Y$_2$O$_3$ (K=15, band gap: 5.6 eV) and 10-15 nm of La$_2$O$_3$ which interfaces with a N+ polysilicon gate 504. It is noted that in one embodiment this interface to the gate 504 is via an optional I-SRN layer. Valence band offsets for holes are provided in the charge blocking layer 510 by successive layers of La$_2$O$_3$ (0.9 eV offset), Y$_2$O$_3$ (1.3 eV offset) and Al$_2$O$_3$ (2.65 eV offset), so that holes injected 516 from the gate are accelerated by the drift field 520 to the trapping sites to enhance hole current during erase operation, as shown in FIG. 5C. In the memory cell 500 of FIG. 5A, a relatively low positive gate potential is imposed for erase operation, while a relatively high positive potential is imposed for write. For multilevel storage, successive positive potentials provide different levels of high threshold voltage states by filling the trapping sites at the two locations of the bulk trapping Ta$_2$O$_5$ and platinum nano-crystals, as discussed earlier. The EOT of the memory cell 500 gate stack is 6 mm with programming voltages of approximately 4 to 5 volts and achieve a 10 ns programming speed.

It is noted that other memory cells in accordance with embodiments of the present invention utilizing differing materials for asymmetric direct tunneling and crested barrier tunnel layers and charge blocking layers and multi-locational trapping layers of both bulk trapping and nano-crystal sub-layers layers, are possible and should be apparent to those skilled in the art with benefit of the present disclosure.

As previously stated, the two common types of EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each non-volatile memory cell of the array matrix are coupled by rows to word select lines (word lines) and their drains are coupled to column bit lines. The source of each non-volatile memory cell is typically coupled to a common source line. The NOR architecture non-volatile memory array is accessed by a row decoder activating a row of non-volatile memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory. It is noted that other memory arrays incorporating memory cell embodiments of the present invention are possible, including but not limited to AND memory arrays and virtual ground memory arrays, and will be apparent to those skilled in the art with the benefit of the present disclosure.

An EEPROM or Flash NAND array architecture also arranges its array of non-volatile memory cells in a matrix such that the gates of each non-volatile memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of non-volatile memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current or voltage encoded stored data values of the row of selected memory cells on the column bit lines. A column page of bit lines is selected and sensed, and then individual data words are selected from the sensed data words from the column page and communicated from the memory device.

Figure 6A:
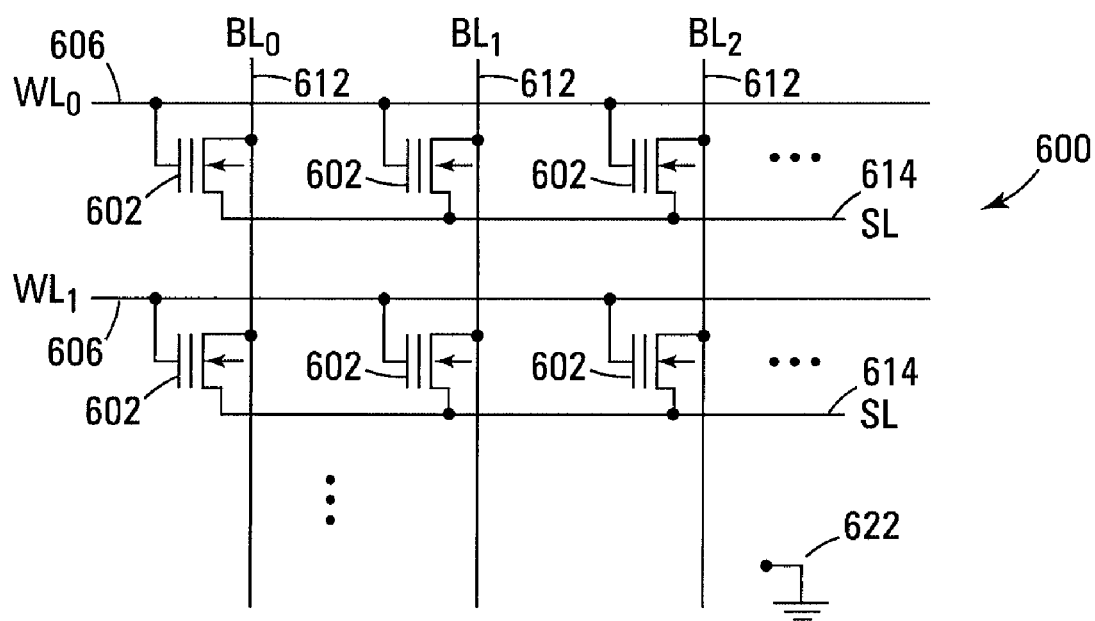
FIGS. 6A and 6B detail NOR and NAND architecture memory arrays in accordance with embodiments of the present invention.

FIG. 6A shows a simplified NOR non-volatile memory array 600 of a EEPROM or Flash memory device of an embodiment of the present invention. In FIG. 6A, a NOR array 600 couples non-volatile memory cells 602 of embodiments of the present invention to bit lines 612, source lines 614, word lines 606, and a substrate connection 222. In forming the NOR array 600, the bit lines 612 and source lines 614 are typically coupled to N+ or P+ doped source/drain regions deposited in the substrate and separated by a channel region. Each memory cell FET 602 has a gate-insulator stack formed over the channel region and between the source/drain regions of a bit line 612 and a source line 614, utilizing the regions as a drain and source respectively (it is noted that the source line 614 may be replaced with a second bit line 612 connection in virtual ground or multi-bit cell arrays, so that the current flow through the memory cell may be reversed). As described above, the gate-insulator stack is made of a composite bandgap engineered direct tunneling or crested barrier tunnel layer formed over the channel region, a composite trapping layer with multiple layers of bulk trapping material and/or embedded nano-crystals formed on the tunnel layer, a charge blocking layer formed on top of the trapping layer, and a control gate 606 (typically formed integral to the word line 606, also known as a control gate line) formed over the charge blocking layer. It is noted that other NOR architecture memory array 600 configurations incorporating embodiments of the present invention are possible and will be apparent to those skilled in the art with the benefit of the present disclosure.

Figure 6B:
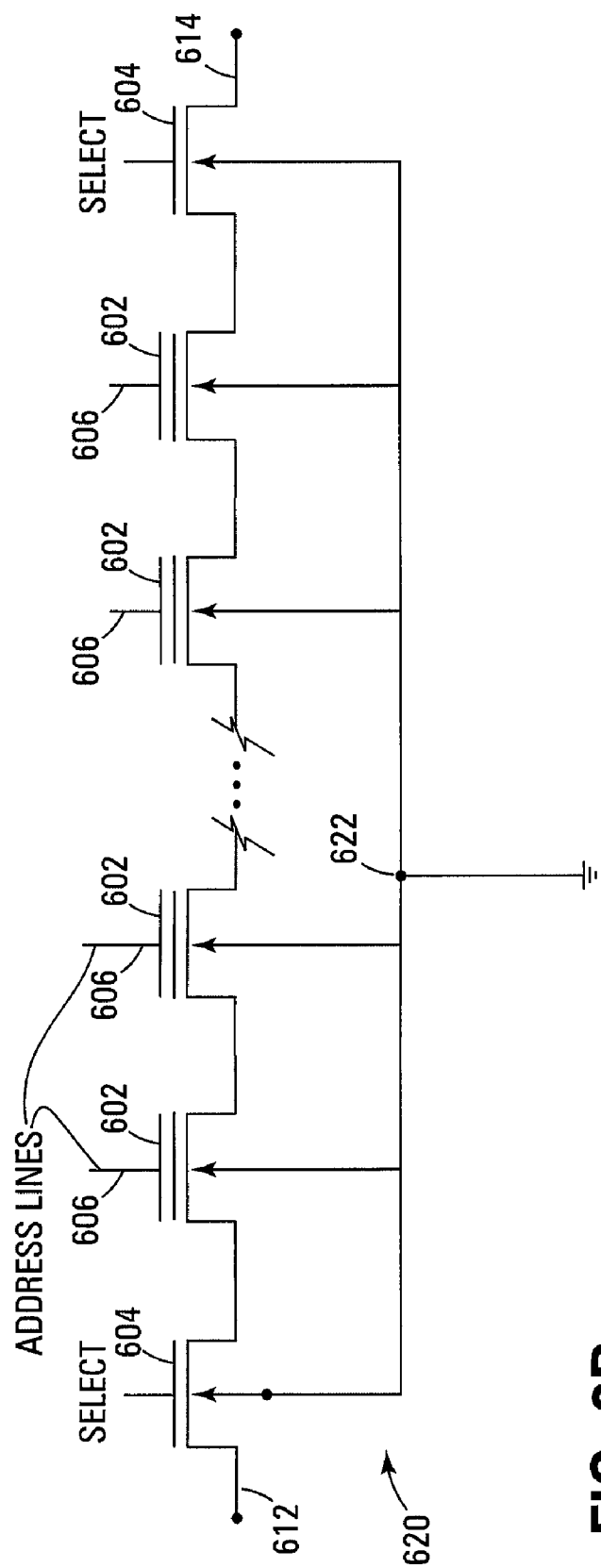

FIG. 6B details a simplified NAND memory string 620 of a NAND architecture EEPROM or Flash memory device of an embodiment of the present invention. In FIG. 6B, a series of non-volatile memory cells 602 of embodiments of the present invention are coupled together source to drain to form a NAND string 620 (typically of 8, 16, 32, or more cells). Each memory cell FET 602 has a gate-insulator stack made of a composite band-gap engineered direct tunneling or crested barrier tunnel layer formed over the channel region, a composite trapping layer with multiple layers of bulk trapping material and/or embedded nano-crystals formed on the tunnel layer, a charge blocking layer formed on top of the trapping layer, and a control gate 606 (typically formed integral to the word line 606, also known as a control gate line) formed over the charge blocking layer. N+ or P+ doped regions are formed between each gate insulator stack to form the source and drain regions of the adjacent non-volatile memory cells, which additionally operate as connectors to couple the cells of the NAND string 620 together. Optional select gates 604, that are coupled to gate select lines, are formed at either end of the NAND non-volatile memory cell string 620 and selectively couple opposite ends of the NAND non-volatile memory cell string 620 to a bit line 612 and a source line 614. In a NAND memory array, the NAND architecture memory string 620 of FIG. 6B would be coupled to bit lines 612, source lines 614, word lines 606, and a substrate connection 622.

Figure 7:
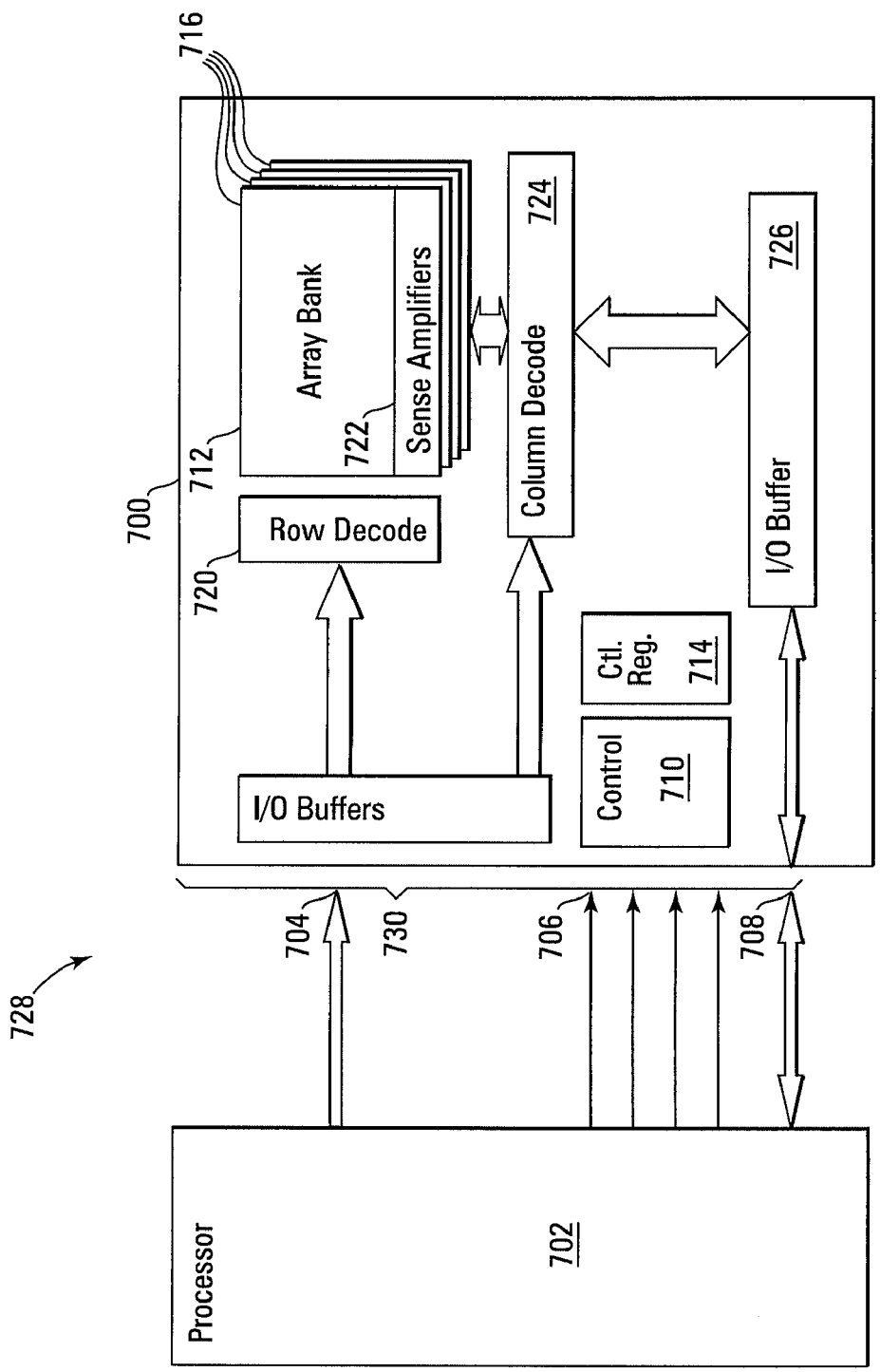
FIG. 7 details a system with a memory device in accordance with embodiments of the present invention.

FIG. 7 shows a simplified diagram of a system 728 incorporating a non-volatile memory device 700 of the present invention coupled to a host 702, which is typically a processing device or memory controller. In one embodiment of the present invention, the non-volatile memory 700 is a NOR architecture Flash memory device or a NAND architecture Flash memory device. The non-volatile memory device 700 has an interface 730 that contains an address interface 704, control interface 706, and data interface 708 that are each coupled to the processing device 702 to allow memory read and write accesses. It is noted that other memory interfaces 730 that can be utilized with embodiments of the present invention exist, such as a combined address/data bus, and will be apparent to those skilled in the art with the benefit of the present disclosure. In one embodiment of the present invention, the interface 730 is a synchronous memory interface, such as a SDRAM or DDR-SDRAM interface. Internal to the non-volatile memory device, an internal memory controller 710 directs the internal operation; managing the non-volatile memory array 712 and updating RAM control registers and non-volatile erase block management registers 714. The RAM control registers and tables 714 are utilized by the internal memory controller 710 during operation of the non-volatile memory device 700. The non-volatile memory array 712 contains a sequence of memory banks or segments 716. Each bank 716 is organized logically into a series of erase blocks (not shown). Memory access addresses are received on the address interface 704 of the non-volatile memory device 700 and divided into a row and column address portions.

On a read access the row address is latched and decoded by row decode circuit 720, which selects and activates a row/page (not shown) of memory cells across a selected memory bank. The bit values encoded in the output of the selected row of memory cells are coupled to a local bit line (not shown) and a global bit line (not shown) and are detected by sense amplifiers 722 associated with the memory bank. The column address of the access is latched and decoded by the column decode circuit 724. The output of the column decode circuit 724 selects the desired column data from the internal data bus (not shown) that is coupled to the outputs of the individual read sense amplifiers 722 and couples them to an I/O buffer 726 for transfer from the memory device 700 through the data interface 708.

On a write access the row decode circuit 720 selects the row page and column decode circuit 724 selects write sense amplifiers 722. Data values to be written are coupled from the I/O buffer 726 via the internal data bus to the write sense amplifiers 722 selected by the column decode circuit 724 and written to the selected non-volatile memory cells (not shown)

of the memory array 712. The written cells are then reselected by the row and column decode circuits 720, 724 and sense amplifiers 722 so that they can be read to verify that the correct values have been programmed into the selected memory cells.

Figure 8:
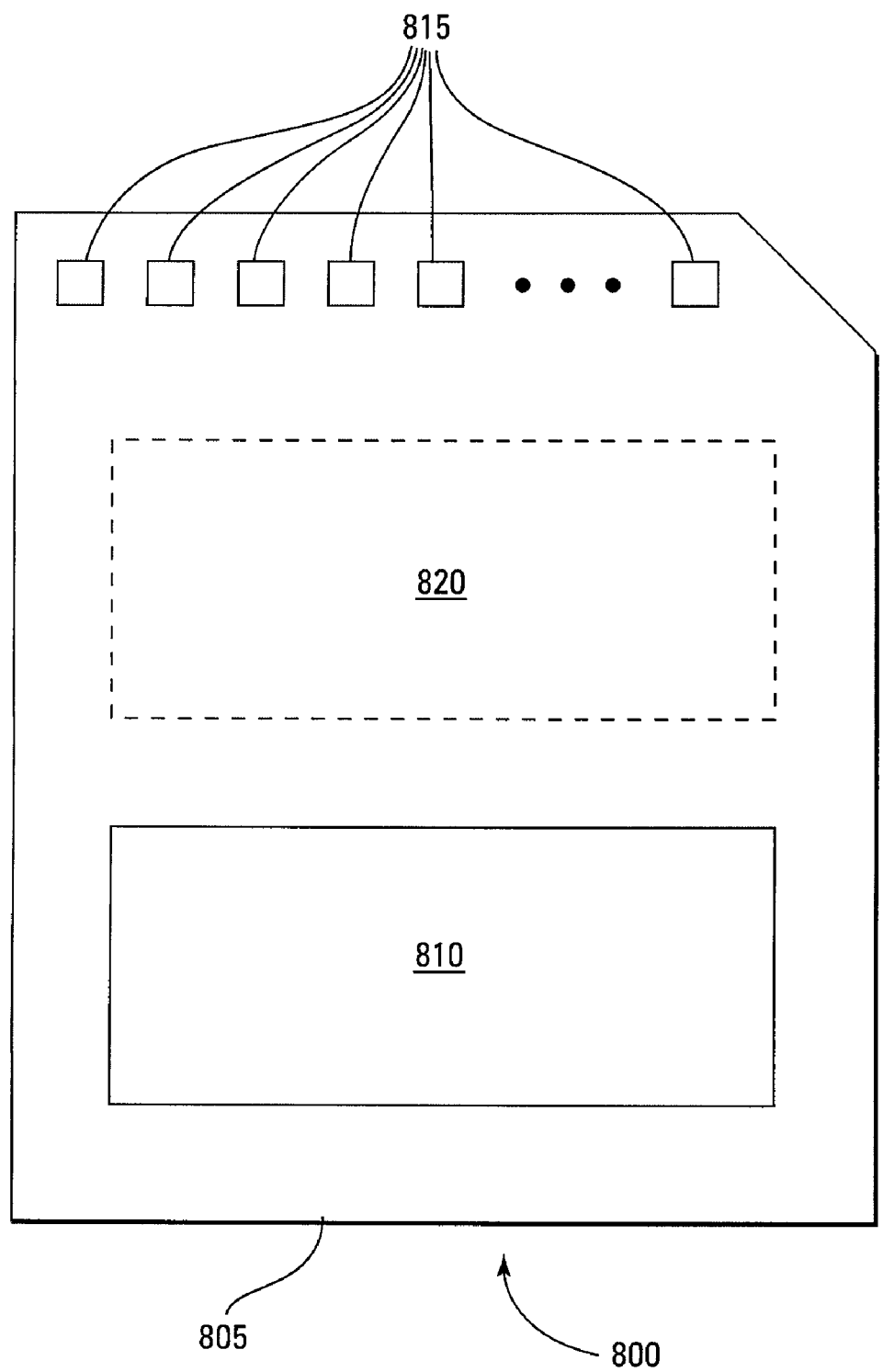
FIG. 8 details a memory module in accordance with embodiments of the present invention.

FIG. 8 is an illustration of an exemplary memory module 800. Memory module 800 is illustrated as a memory card, although the concepts discussed with reference to memory module 800 are applicable to other types of removable or portable memory, e.g., USB flash drives, and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 is a non-volatile memory including memory cell circuits of or adapted to perform methods of the present invention. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820 which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of I/O connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC (application specific integrated circuit). Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

Various kinds of RAM and DRAMs are commonly used. Typical examples are the synchronous DRAM (SDRAM) in which data is stored or retrieved in synchronism with a system clock and a double-data-rate SDRAM (DDR-SDRAM) which makes it possible to use both edges of a clock pulse as triggers for data access. In addition to the above described DRAMs, a RAMBUS DRAM (RDRAM) (under specifications of Rambus Inc.) in which data transfer is enabled at a high speed with a protocol-based command, and the like have also been developed. Other common RAM memory styles include, but are not limited to, static RAM (SRAM), synchronous graphics RAM (SGRAM), quad-data-rate SDRAM (QDR-SDRAM), video RAM (V-RAM), Fast Page Mode (FPM) DRAM, EDO (Extended Data Output) DRAM and BEDO (Burst Extended Data Output) DRAM. In addition, in many cases, memory interfaces/busses that utilize DRAM's will utilize memory modules that typically combine one or more DRAM memory devices in a single module or circuit card. In some embodiments of the present, RAM and DRAM memory modules will include a housing to enclose one or more memory devices, though such a housing is also not essential to all devices or device applications, wherein at least one memory device of the RAM or DRAM memory module is a memory device including memory cell circuits of or adapted to perform methods of the present invention. In one embodiment the memory device is utilized as a non-volatile universal memory device replacement for both RAM and ROM in a system.

It is noted that other memory cells, memory strings, arrays, and memory devices in accordance with embodiments of the present invention are possible and should be apparent to those skilled in the art with benefit of the present disclosure.

CONCLUSION

Non-volatile memory devices and arrays have been described that utilize band engineered gate-stacks and multiple charge trapping layers allowing a multiple trapping site gate-insulator stack memory cell that utilizes a band engineered direct tunneling or crested barrier tunnel layer for high speed programming and erasure. Charge retention is enhanced by utilization of nano-crystals and/or bulk trapping materials in a composite non-conductive trapping layer and a high K dielectric charge blocking layer. The band-gap engineered gate-stack with symmetric or asymmetric direct tunneling or crested barrier tunnel layers and charge blocking layer of the non-volatile memory cells of embodiments of the present invention allow for low voltage high speed tunneling programming and erase with electrons and holes, while maintaining high charge blocking barriers and deep carrier trapping sites for good charge retention. The low voltage enhanced Fowler-Nordhiem tunneling or direct tunneling program and erase capability reduces damage to the gate-stack and the crystal lattice from high energy carriers, reducing write fatigue and leakage issues and enhancing device lifespan, while allowing for memory cells that can take advantage of progressive lithographic and feature size scaling. Memory cell embodiments of the present invention allow multiple levels of bit storage in a single memory cell through multiple charge centroids and/or multiple threshold voltage levels.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of storing multiple data-bits in a non-volatile memory cell, comprising:
    trapping carriers in a composite trapping layer formed over a tunnel insulator layer, wherein the composite trapping layer contains a plurality of band engineered sub-layers providing a plurality of charge trapping layers;
    wherein at least one charge trapping layer of the plurality of charge trapping layers is between the tunnel insulator layer and another charge trapping layer of the plurality of charge trapping layers.

2. The method of claim 1, wherein trapping the carriers in the composite trapping layer comprises trapping the carriers in a plurality of charge trapping layers to store multiple bits of data in one or more threshold voltage levels.

3. The method of claim 2, wherein trapping the carriers in a plurality of charge trapping layers comprises trapping the carriers in the plurality of charge trapping layers containing a plurality of charge trapping sites.

4. The method of claim 1, further comprising programming the non-volatile memory cell by tunneling of carriers through the tunnel insulator layer to the composite trapping layer, wherein the tunnel insulator layer is band-engineered tunnel insulator layer having one or more sub-layers formed adjacent to a channel region of the non-volatile memory cell, wherein the one or more sub-layers comprise layers of materials adapted to allow Fowler-Nordheim or direct tunneling injection of electrons from the channel region to the composite charge trapping layer.

5. The method of claim 1, further comprising erasing the non-volatile memory cell through injecting holes from a control gate formed over a band-engineered charge blocking layer formed over the composite trapping layer, wherein the band-engineered charge blocking layer is adapted to allow Fowler-Nordheim or direct tunneling injection of holes from the control gate to the composite trapping layer.

6. A method of storing multiple data-bits in a non-volatile memory cell, comprising:
    trapping carriers in a composite trapping layer formed over a tunnel insulator layer, wherein the composite trapping layer formed over a tunnel insulator layer layers providing a plurality of charge trapping layers;
    wherein trapping the carriers in the composite trapping layer comprises trapping the carriers in a plurality of charge trapping layers to store multiple bits of data in one or more threshold voltage levels; and
    wherein trapping the carriers in the plurality of charge trapping layers comprises trapping the carriers in two or more charge centroids of the plurality of charge trapping layers.

7. A method of storing multiple data-bits in a non-volatile memory cell, comprising:
    trapping carriers in a composite trapping layer formed over a tunnel insulator layer, wherein the composite trapping layer contains a plurality of band engineered sub-layers providing a plurality of charge trapping layers;
    wherein trapping the carriers in the composite trapping layer comprises trapping electrons in a first charge centroid when a first positive potential is applied to a control gate of the non-volatile memory cell relative to a channel of the non-volatile memory cell.

8. The method of claim 7, wherein trapping the carriers in the composite trapping layer further comprises trapping electrons in the first charge centroid and a second charge centroid when a second positive potential is applied to the control gate of the non-volatile memory cell relative to the channel of the non-volatile memory cell, wherein the second positive potential is greater than the first positive potential.

9. The method of claim 8, wherein trapping the carriers in the composite trapping layer further comprises trapping electrons in the first charge centroid, the second charge centroid and a third charge centroid when a third positive potential is applied to the control gate of the non-volatile memory cell relative to the channel of the non-volatile memory cell, wherein the third positive potential is greater than the second positive potential.

10. The method of claim 9, wherein trapping the carriers in the composite trapping layer further comprises trapping electrons in the first charge centroid, the second charge centroid, the third charge centroid and a fourth charge centroid when a fourth positive potential is applied to the control gate of the non-volatile memory cell relative to the channel of the non-volatile memory cell, wherein the fourth positive potential is greater than the third positive potential.

11. The method of claim 7, further comprising neutralizing the electrons in the first charge centroid with holes by applying a particular positive potential to the control gate of the non-volatile memory cell relative to the channel of the non-volatile memory cell, wherein the particular positive potential is less than the first positive potential.

12. A method of operating a non-volatile memory cell having a tunnel insulator formed over a channel region, a composite trapping layer formed over the tunnel insulator, a charge blocking insulator formed over the composite trapping layer and a control gate formed over the charge blocking insulator, the method comprising:
    trapping electrons in a first charge trapping layer of the composite trapping layer to store a first data value in the non-volatile memory cell corresponding to a first representation of two or more data-bits, wherein the composite trapping layer contains a plurality of band engineered sub-layers providing a plurality of charge trapping layers; and
    trapping electrons in the first charge trapping layer and a second charge trapping layer of the composite trapping layer to store a second data value in the non-volatile memory cell corresponding to a second representation of the two or more data-bits.
    wherein the first charge trapping layer is between the second charge trapping layer and the tunnel insulator.

13. The method of claim 12, wherein trapping electrons in the first charge trapping layer of the composite trapping layer comprises injecting electrons into the first charge trapping layer through the tunnel insulator.

14. A method of operating a non-volatile memory cell having a tunnel insulator formed over a channel region, a composite trapping layer formed over the tunnel insulator, a charge blocking insulator formed over the composite trapping layer and a control gate formed over the charge blocking insulator, the method comprising:
    trapping electrons in a first charge trapping layer of the composite trapping layer to store a first data value in the non-volatile memory cell corresponding to a first representation of two or more data-bits, wherein the composite trapping layer contains a plurality of band engineered sub-layers providing a plurality of charge trapping layers;

trapping electrons in the first charge trapping layer and a second charge trapping layer of the composite trapping layer to store a second data value in the non-volatile memory cell corresponding to a second representation of the two or more data-bit; and trapping electrons in the first charge trapping layer, the second charge trapping layer and a third charge trapping layer of the composite trapping layer to store a third data value in the non-volatile memory cell corresponding to a third representation of the two or more data-bits.

15. The method of claim 14, further comprising:
trapping holes in the plurality of charge trapping layers of the composite trapping layer to store a fourth data value in the non-volatile memory cell corresponding to a fourth representation of the two or more data-bits.

16. The method of claim 15, wherein trapping holes in the plurality of charge trapping layers of the composite trapping layer comprises injecting holes into the plurality of charge trapping layers through the charge-blocking insulator.

17. The method of claim 16, wherein injecting holes through the charge-blocking insulator comprises injecting holes across a hole energy barrier of 0.9 eV.

18. A method of operating a non-volatile memory cell having a tunnel insulator formed over a channel region, a composite trapping layer formed over the tunnel insulator, a charge blocking insulator formed over the composite trapping layer and a control gate formed over the charge blocking insulator, the method comprising:

trapping electrons in a first charge trapping layer of the composite trapping layer to store a first data value in the non-volatile memory cell corresponding to a first representation of two or more data-bits, wherein the composite trapping layer contains a plurality of band engineered sub-layers providing a plurality of charge trapping layers;

wherein trapping electrons in the first charge trapping layer of the composite trapping layer comprises injecting electrons into the first charge trapping layer through the tunnel insulator; and wherein injecting electrons through the tunnel insulator comprises injecting electrons across an electron energy barrier of less than 2.1 eV.

19. The method of claim 18, wherein injecting electrons through the tunnel insulator comprises injecting electrons across an electron energy barrier of less than 1.65 eV.

20. The method of claim 18, wherein injecting electrons through the tunnel insulator further comprises injecting electrons across a tunnel insulator having a hole energy barrier of greater than 3.05 eV.

* * * * *

UNITED STATES PATENT AND TRADEMARK OFFICE
CERTIFICATE OF CORRECTION

| | | |
|---|---|---|
| PATENT NO. | : 8,159,875 B2 | Page 1 of 1 |
| APPLICATION NO. | : 12/547130 | |
| DATED | : April 17, 2012 | |
| INVENTOR(S) | : Arup Bhattacharyya | |

It is certified that error appears in the above-identified patent and that said Letters Patent is hereby corrected as shown below:

In column 15, line 52, in Claim 6, delete "formed over a tunnel insulator layer layers" and insert -- contains a plurality of band engineered sub-layers --, therefor.

In column 16, line 52, in Claim 12, delete "data-bits." and insert -- data-bits; --, therefor.

Signed and Sealed this
Twelfth Day of June, 2012

David J. Kappos
*Director of the United States Patent and Trademark Office*